(12) United States Patent
Kim et al.

(10) Patent No.: US 7,209,025 B2
(45) Date of Patent: Apr. 24, 2007

(54) MULTILAYER INDUCTOR WITH SHIELDING PLANE

(75) Inventors: Hyunjun Kim, Chandler, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/736,336

(22) Filed: Dec. 15, 2003

(65) Prior Publication Data

US 2005/0128041 A1 Jun. 16, 2005

(51) Int. Cl.
*H01F 5/00* (2006.01)
*H01F 7/06* (2006.01)

(52) U.S. Cl. ............... 336/200; 336/223; 29/602.1

(58) Field of Classification Search ........ 336/200, 336/223, 232; 29/602.1, 605
See application file for complete search history.

(56) References Cited

U.S. PATENT DOCUMENTS

| | | | | |
|---|---|---|---|---|
| 5,510,758 | A * | 4/1996 | Fujita et al. ............. | 333/247 |
| 6,730,983 | B2 * | 5/2004 | Minami ................... | 257/531 |
| 6,759,937 | B2 * | 7/2004 | Kyriazidou ............. | 336/200 |
| 6,791,435 | B2 * | 9/2004 | Shingaki et al. ........ | 333/175 |
| 6,870,256 | B2 * | 3/2005 | Aoki et al. .............. | 257/700 |
| 6,927,664 | B2 * | 8/2005 | Nakatani et al. ........ | 336/200 |

FOREIGN PATENT DOCUMENTS

| | | | |
|---|---|---|---|
| JP | 11-219825 | * | 8/1999 |
| JP | 11219825 A | * | 8/1999 |
| JP | 2004031922 A | * | 1/2004 |

OTHER PUBLICATIONS

Yue et al., "On Chip Spiral Inductors with Patterned Ground Shields for Si-Based RF IC's", May 1998, IEEE Journal of Solid State Circuits, vol. 33, No. 5. pp. 743-752.*
Davis, M.F. et al.: "RF-Microwave Multi-band Design Solutions for Multilayer Organic System on Package Integrated Passives", NSF Packaging Research Center, Yamacraw Design Center, School of ECE, Georgia Institute of Technology, Atlanta, GA 30312. 4pgs.
Davis, Mekita F. et al.: "Integrated RF Architectures in Fully-Organic SOP Technology", IEEE Transactions on Advanced Packaging, vol. 25, No. 2, May 2002, ISSN: 1521-3323. pp. 136-142.
Bushyager, Nathan et al.: "Q-Factor Prediction and Optimization of Multilayer Inductors for RF Packaging Microsystems Using Time Domain Techniques", The Georgia Institute of Technology, 4pgs.
Dalmia, Sidharth et al.: "Design of Embedded High Q-Inductors in MCM-L Technology", Georgia Institute of Technology. 4pgs.

* cited by examiner

*Primary Examiner*—Anh Mai
(74) *Attorney, Agent, or Firm*—Buckley, Maschoff & Talwalkar LLC

(57) ABSTRACT

Some embodiments provide a first portion of an inductor disposed in a first layer of a multilayer substrate, a second portion of the inductor disposed in a second layer of the multilayer substrate, the second portion coupled to the first portion, and a shielding plane disposed between the first portion and the second portion.

12 Claims, 9 Drawing Sheets

MULTILAYER INDUCTOR WITH SHIELDING PLANE

BACKGROUND

An integrated circuit (IC) package may include electrical components designed to improve one or more functions of the IC package. For example, an IC package may include embedded or surface-mounted capacitors for reducing resonance between the IC package and a substrate on which the package is mounted. An IC package may also or alternatively include integrated inductors. Integrated inductors may be used to improve the quality of signals carried by the IC package.

An integrated inductor may be used in an IC package or in other types of devices. The usefulness of an integrated inductor in a particular design may depend on the inductance of the inductor as well as on the geometrical dimensions of the inductor. Such dimensions include, for example, the total trace length, the trace width, and the spacing between traces. It is often desirable to increase the inductance, and therefore the Quality Factor (Q), of an integrated inductor for a given set of geometric constraints.

DETAILED DESCRIPTION

Figure 1:
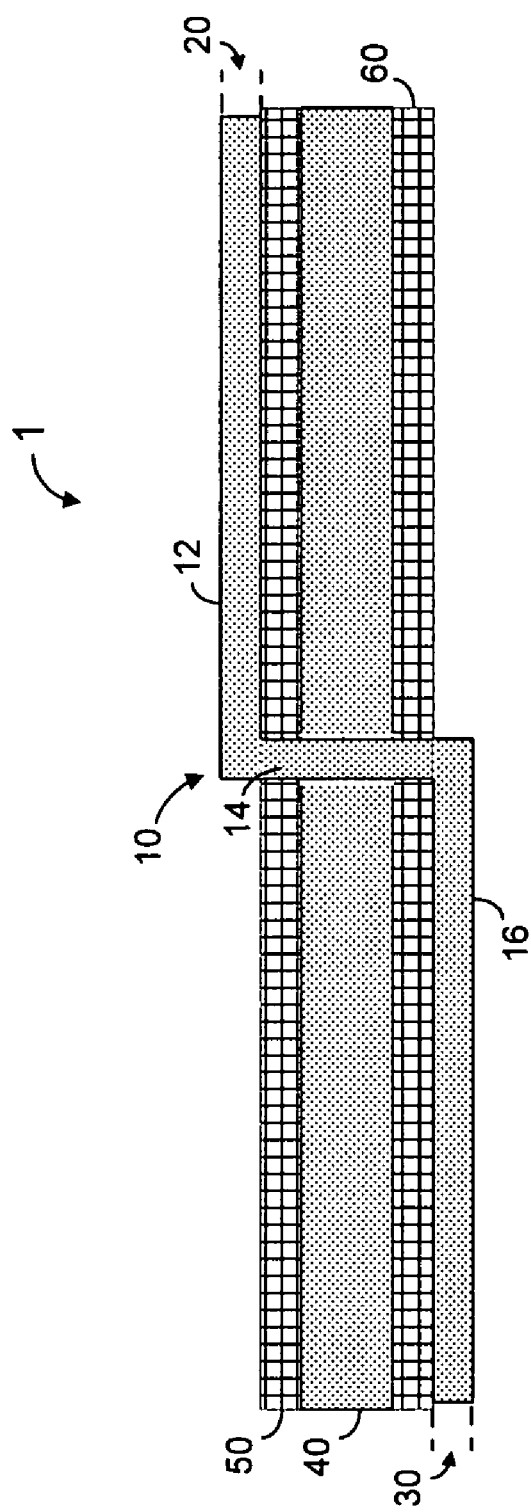
FIG. 1 is a cross-sectional side view of an inductor according to some embodiments.

FIG. 1 is a cross-sectional side view of a portion of device 1 according to some embodiments. Device 1 may comprise an IC package suitable for receiving an IC die and for electrically coupling the IC die to external components/circuitry. Device 1 may comprise a multilayer substrate composed of any ceramic, organic, and/or other suitable material.

Device 1 includes inductor 10. Inductor 10 may comprise a spiral turn inductor and may be composed of any suitable conductive material, including but not limited to copper. Inductor 10 comprises first portion 12, via portion 14, and second portion 16. Via portion 14 electrically couples first portion 12 to second portion 14. Two or more of portions 12, 14 and 16 may be integral with one another. A pin-through hole couples first portion 12 to second portion 16 in some embodiments.

First portion 12 is disposed in layer 20 of device 1, and second portion 16 is disposed in layer 30 of device 1. Unshown elements may disposed in layer 20 and/or layer 30, including conductive traces and dielectric material. Moreover, one or more layers may reside on layer 20 and/or layer 30. Each of these unshown layers may comprise conductive traces for routing signals within device 1, dielectric material, and/or other elements.

Shielding plane 40 is disposed between first portion 12 and second portion 16. In some embodiments, shielding plane 40 is a ground plane. Device 1 may comprise one or more ground planes. In this regard, inductor 10 may comprise a third portion that is disposed in an unshown third layer of device 1 and is coupled to second portion 16. A second shielding plane may be disposed between the third portion and second portion 16.

Some embodiments may reduce a mutual inductance between different portions of inductor 10 with respect to conventional designs, which in turn may increase the inductance and the Q of inductor 10.

Dielectric 50 is disposed between first portion 12 and shielding plane 40. Dielectric 60 is similarly disposed between second portion 16 and shielding plane 40. Dielectric 50 and/or dielectric 60 may be composed of any suitable material, including but not limited to bismalemide triazine (BT) and FR4 in some embodiments.

According to some embodiments, device 1 is manufactured by fabricating layer 30 including portion 16 of inductor 10, fabricating shielding plane 40 above layer 30, and fabricating layer 20 including portion 12 above shielding plane 40. Shielding plane 40 according to these embodiments comprises a coupling to electrically couple portion 16 to the portion 12. This coupling may comprise a via such as via portion 14, a pin-through hole, or another suitable coupling that does not directly contact shielding plane 40. In some embodiments, a second shielding plane is fabricated above the third layer, and a fifth layer including a third portion of inductor 10 is fabricated above the fourth layer. The second shielding layer may comprise a second coupling to electrically couple portion 12 to the third portion of inductor 10.

Figure 2A:
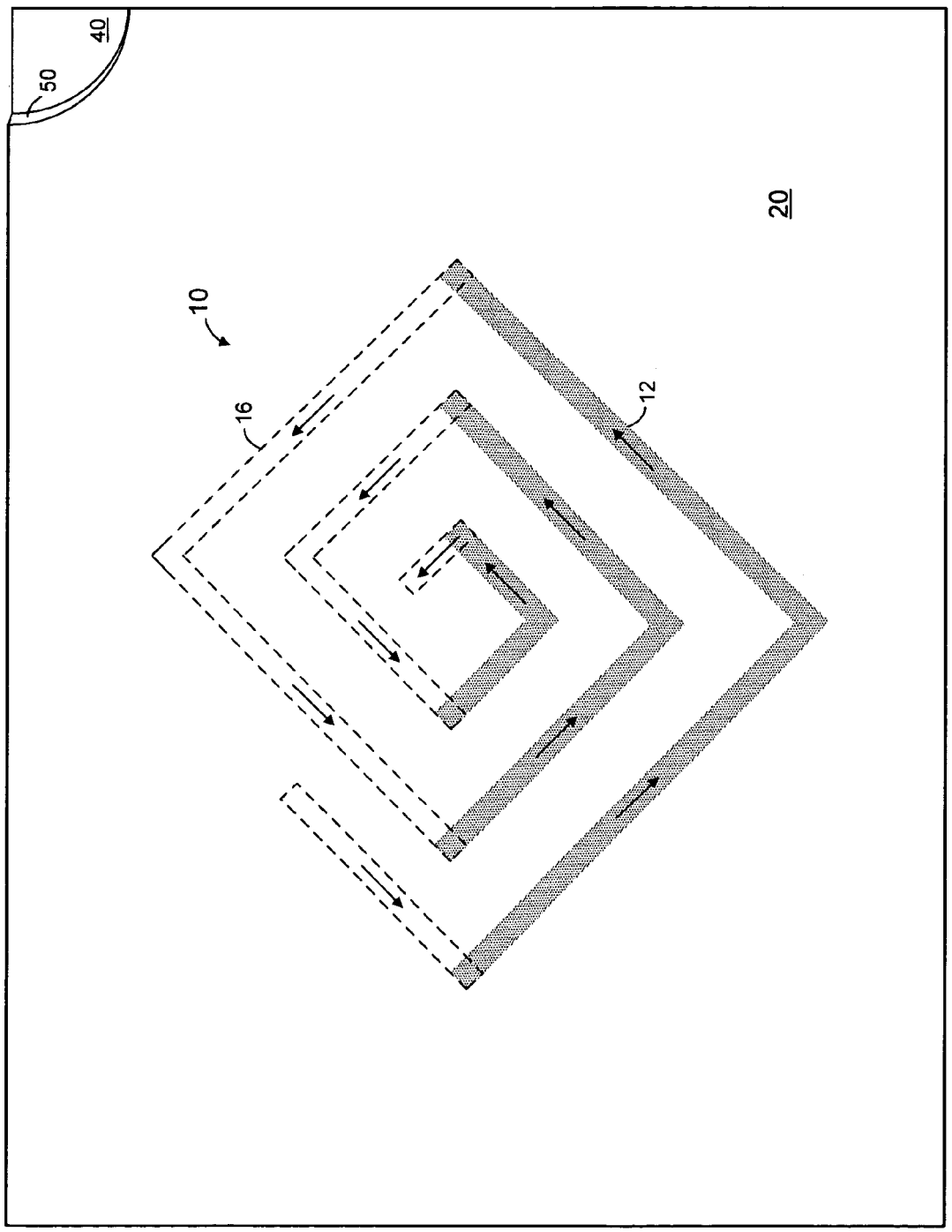
FIG. 2A is a view of an IC package layer according to some embodiments.

FIG. 2A is a view of layer 20 according to some embodiments. Inductor 10 is depicted as a rectangular spiral inductor with portion 12 located in layer 20. Dashed lines of FIG. 2A depict a relative position of portion 16 to portion 12. Shielding plane 40, shown by cutting away a portion of layer 50, is disposed between portion 16 and portion 12.

Figure 2B:
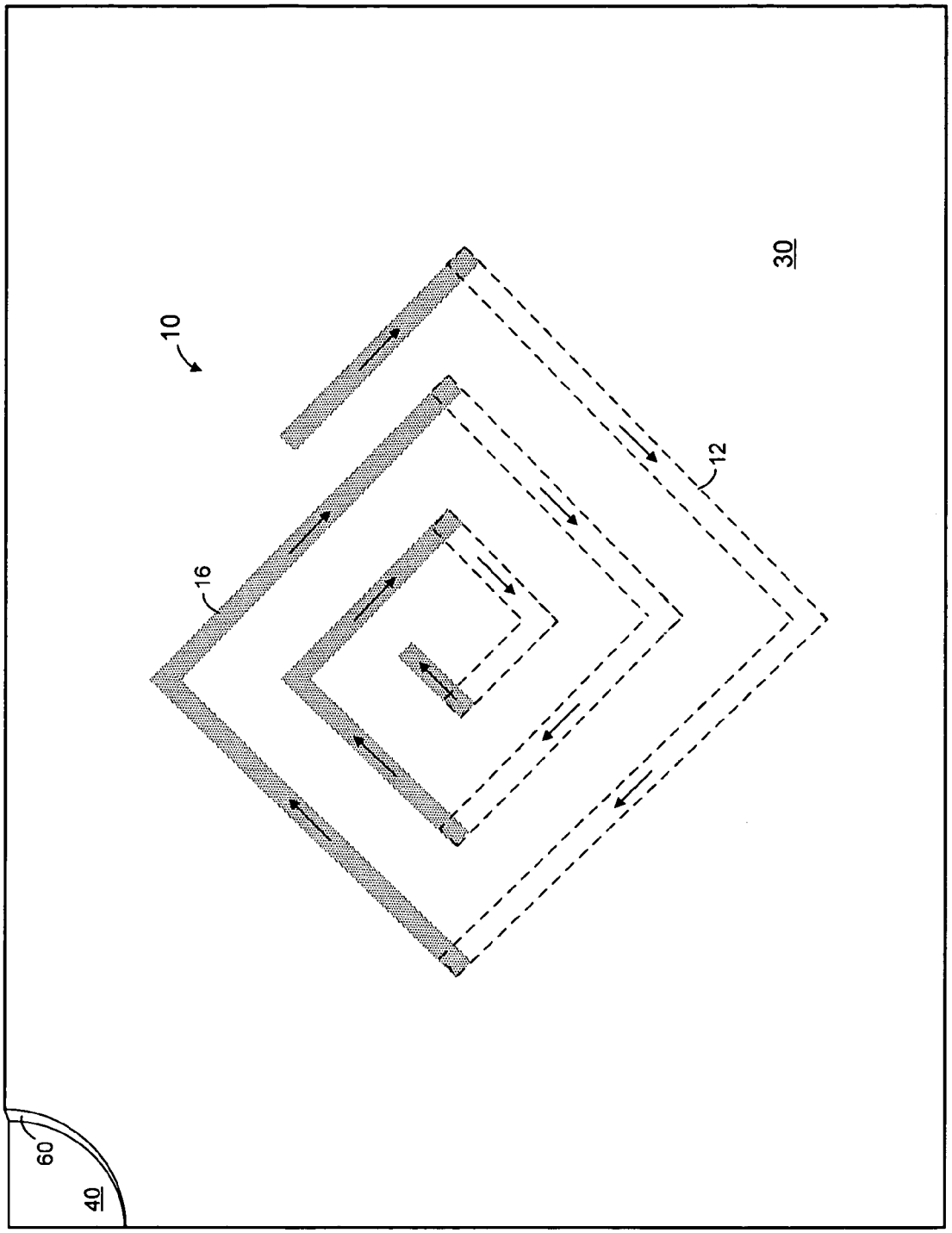
FIG. 2B is a view of an IC package layer according to some embodiments.

FIG. 2B is a view of layer 30 according to the embodiment of FIG. 2A. Dashed lines of FIG. 2B depict a relative position of portion 12 to portion 16. Shielding plane 40 is shown by cutting away a portion of layer 60 that is adjacent to the portion of layer 50 shown cut away in FIG. 2A. Again, shielding plane 40 is disposed between portion 16 and portion 12.

Figure 3:
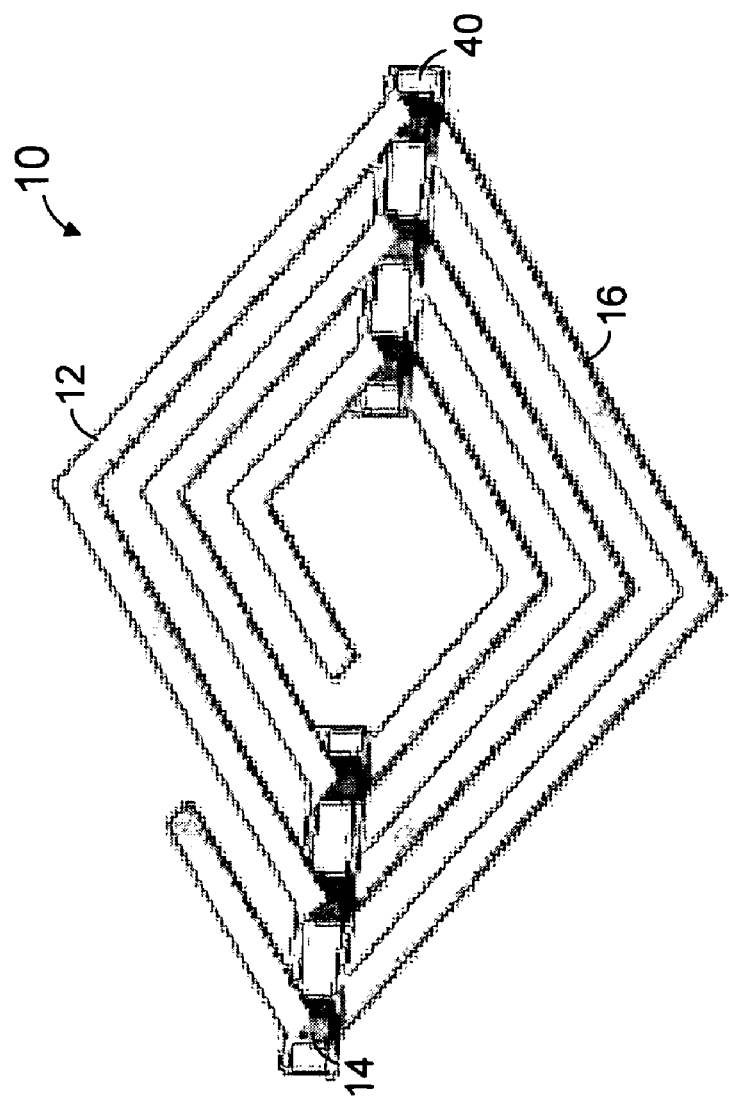
FIG. 3 is a perspective cutaway view of a multilayer inductor according to some embodiments.

FIG. 3 is a perspective cutaway view of inductor 10 according to some embodiments. Inductor 10 of FIG. 3 is a rectangular spiral inductor. FIG. 3 shows only portions 12, 14 and 16 of inductor 10 along with a cross-sectional portion of shielding plane 40 in which via portions 14 reside. Other elements of device 1 as illustrated in FIG. 1, FIG. 2A and FIG. 2B are omitted for clarity. Embodiments may include none, some, or all of these elements.

Figure 4A:
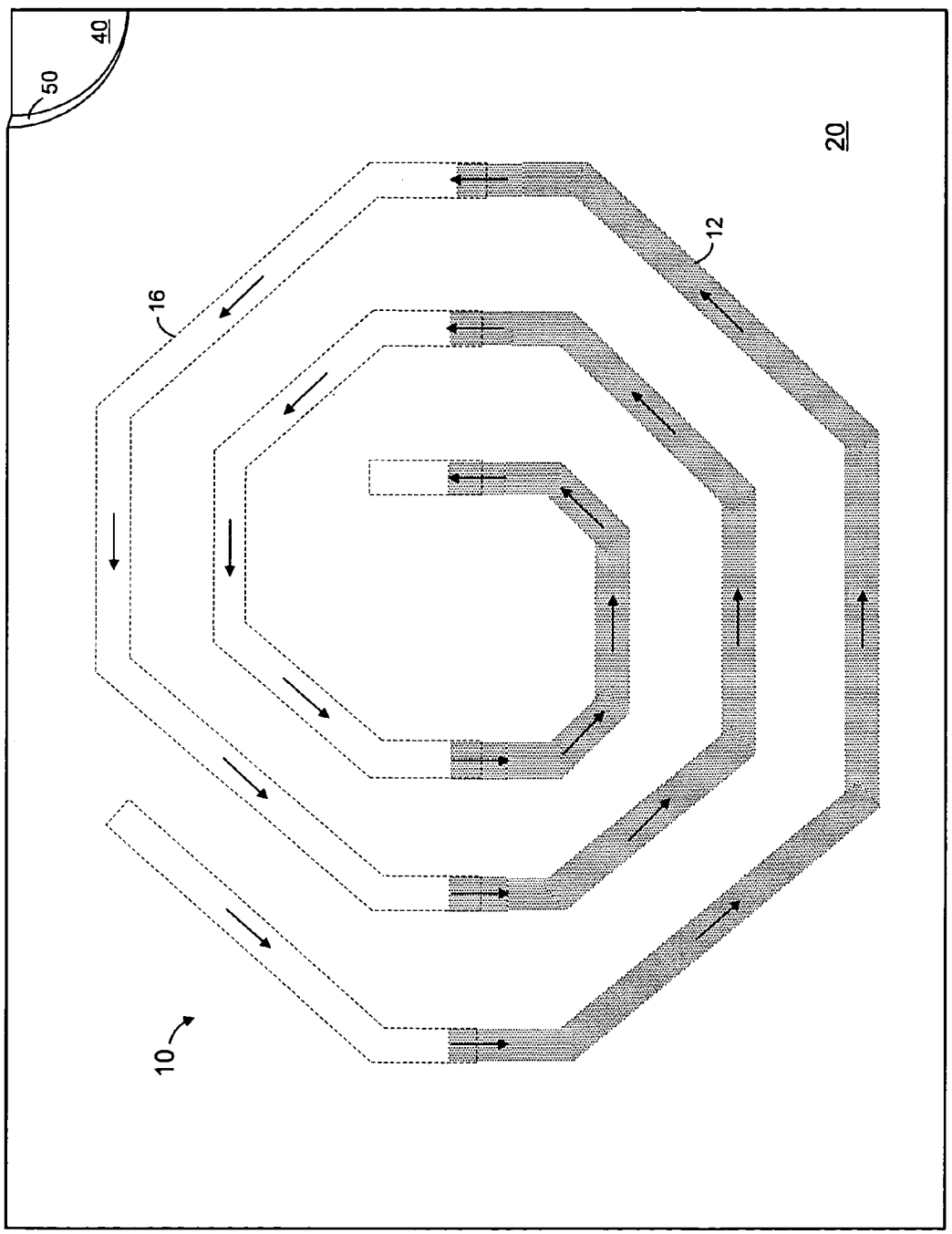
FIG. 4A is a view of an IC package layer according to some embodiments.

FIG. 4A is a view of layer 20 according to some embodiments in which inductor 10 is a circular spiral inductor with portion 12 located in layer 20. A relative position of portion 16 with respect to portion 12 is depicted by dashed lines. Shielding plane 40 is disposed between portion 16 and portion 12, as shown by the cut away portion of layer 50.

Figure 4B:
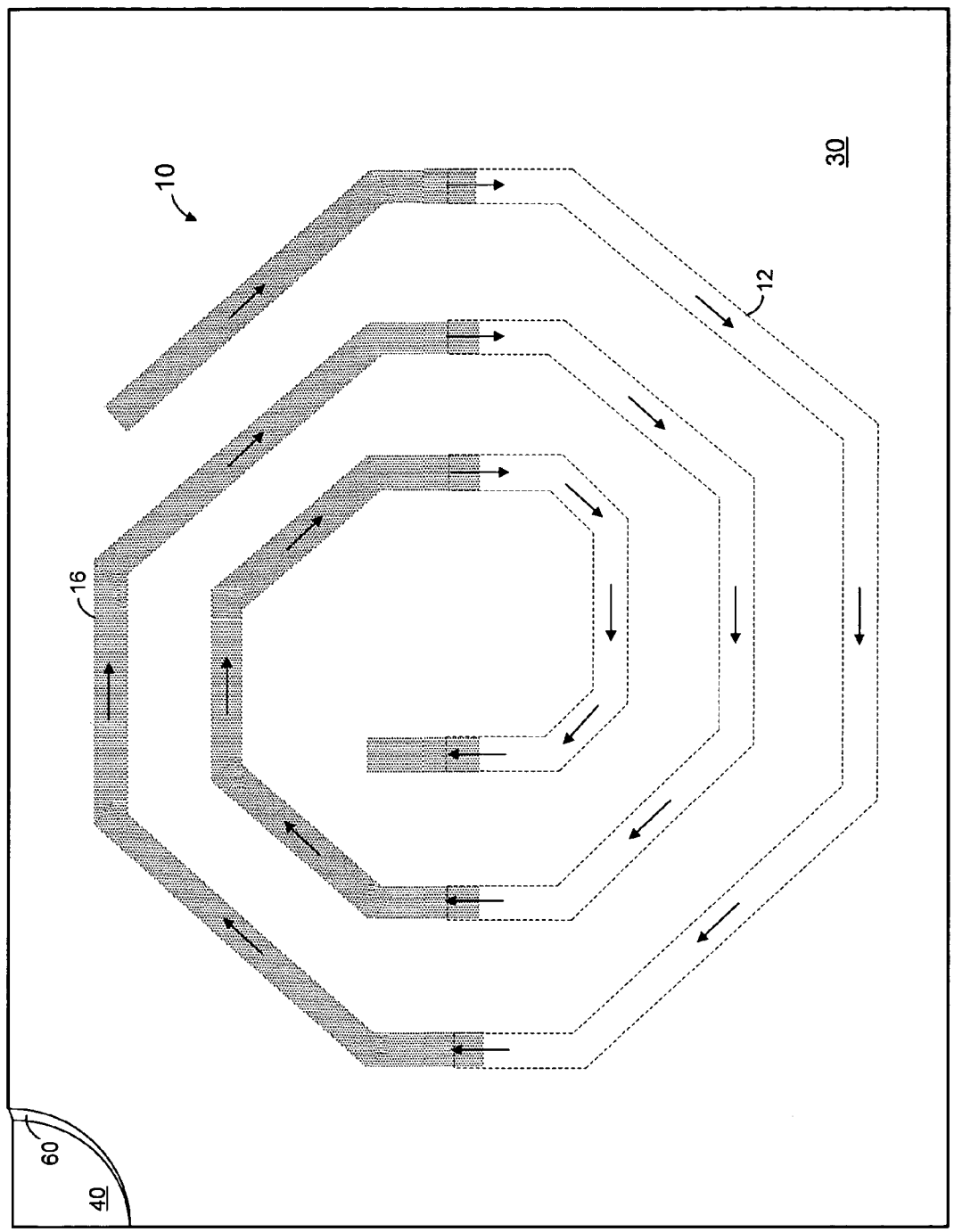
FIG. 4B is a view of an IC package layer according to some embodiments.

FIG. 4B is a view of layer 30 according to the embodiment of FIG. 4A. Dashed lines of FIG. 4B depict a relative position of portion 12 with respect to portion 16. The cut away portion of layer 60 is adjacent to the portion of layer 50 shown cut away in FIG. 4A. Shielding plane 40 is disposed between portion 16 and portion 12.

The arrows of FIG. 2A, FIG. 2B, FIG. 4A, and FIG. 4B depict current flow through inductor 10 according to some embodiments. As shown, shielding plane 40 may separate portions of inductor 10 in which current flows in one direction from portions in which current flows in an opposite direction. An arrangement of inductor 10 according to some embodiments may reduce mutual inductance between different portions of inductor 10. Such a reduction may increase the inductance and the Q of inductor 10 with respect to conventional designs.

Figure 5:
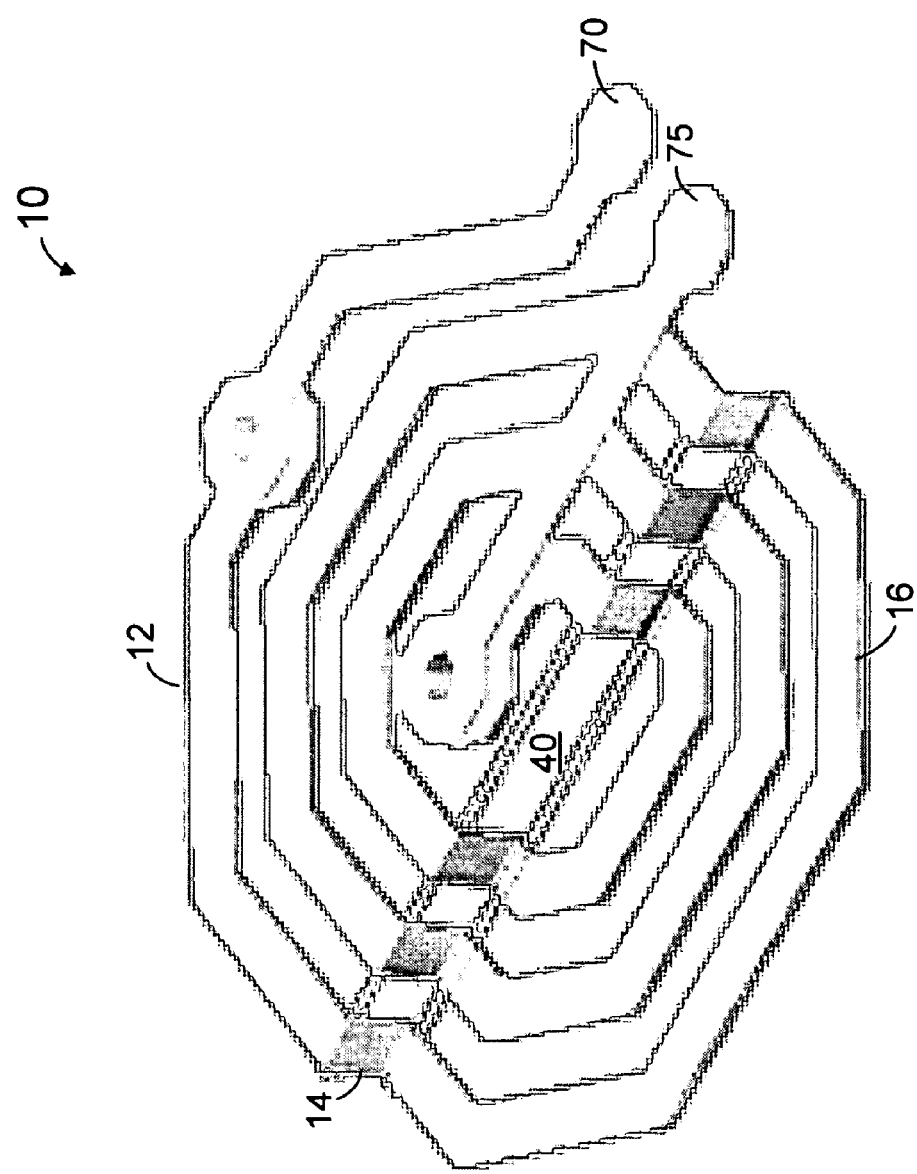
FIG. 5 is a perspective cutaway view of a multilayer inductor according to some embodiments.

FIG. 5 is a perspective cutaway view of inductor 10 according to some embodiments. As described with respect to FIG. 3, inductor 10 as shown in FIG. 5 includes only portions 12, 14 and 16 of inductor 10 along with a cross-sectional portion of shielding plane 40 in which via portions 14 reside. Also shown in FIG. 5 are terminals 70 and 75 for connecting inductor 10 to external circuitry.

Figure 6:
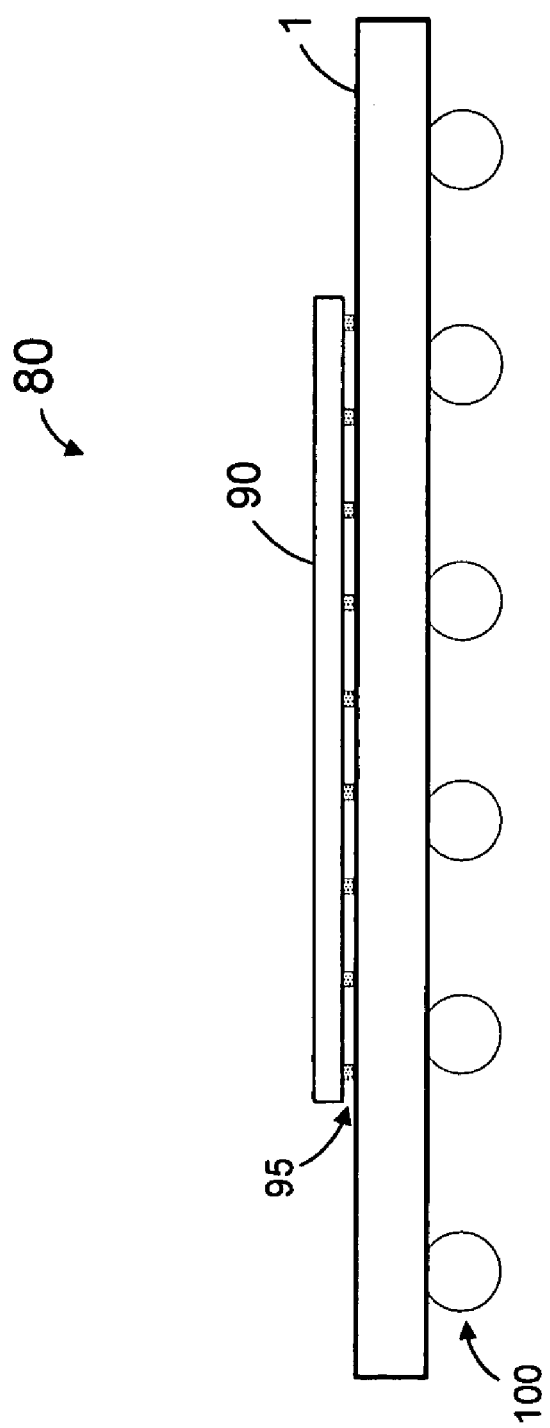
FIG. 6 is a side elevational view of an IC die and IC package according to some embodiments.

FIG. 6 is a side elevational view of system 80 according to some embodiments. System 80 includes IC die 90 and device 1. IC die 90 includes integrated electrical devices and may be fabricated using any suitable material and fabrication techniques. IC die 90 may provide one or more functions. In some embodiments, IC die 90 comprises a chipset having a silicon substrate and suitable for wireless communication platforms.

Electrical contacts 95 are coupled to IC die 90 and may comprise Controlled Collapse Chip Connect (C4) solder bumps. Electrical contacts 95 may be electrically coupled to the electrical devices that are integrated into IC die 90. The electrical devices may reside between a substrate of IC die 90 and electrical contacts 95 in a "flip-chip" arrangement. In some embodiments, such a substrate resides between the electrical devices and electrical contacts 95.

Electrical contacts 55 are also coupled to electrical contacts (not shown) of device 1, which comprises an IC package. In some embodiments, die 90 is electrically coupled to device 1 via wirebonds in addition to or as an alternative to electrical contacts 95. Device 1 is coupled to solder balls 100 for carrying power and I/O signals between IC die 90 and external devices. For example, solder balls 65 may be mounted directly to a motherboard (not shown) or onto an interposer that is in turn mounted directly to a motherboard. Alternative interconnects such as through-hole pins may be used instead of solder balls 95 to mount system 80 to a motherboard, a socket, or another substrate.

Figure 7:
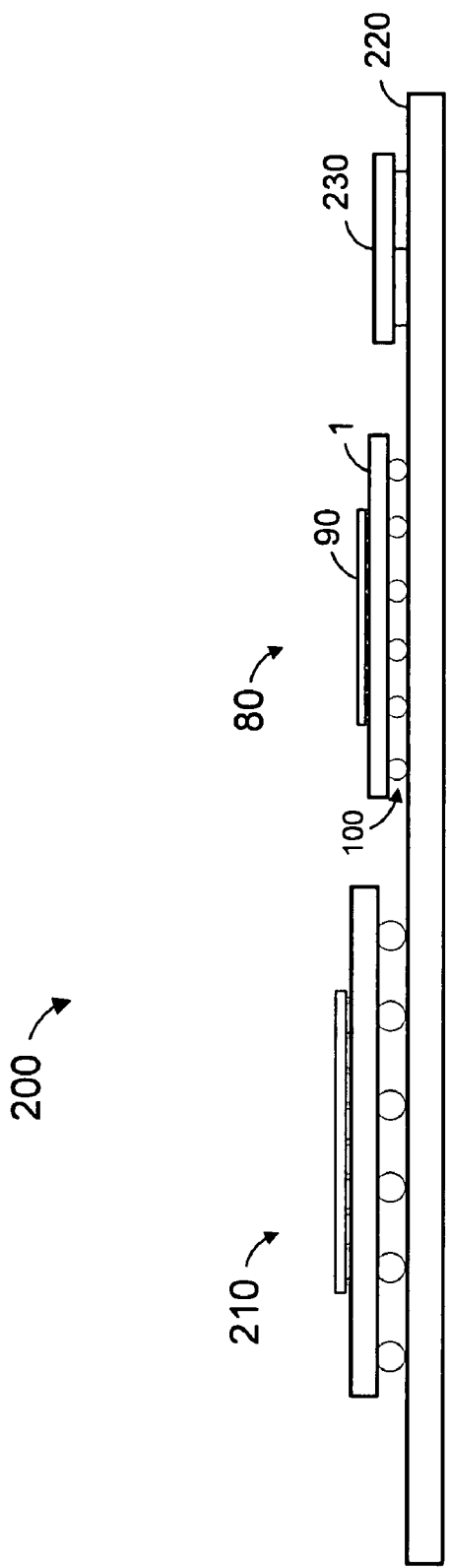
FIG. 7 is a side elevational view of a system according to some embodiments.

FIG. 7 is a side elevation of system 200 according to some embodiments. System 200 includes system 80 of FIG. 6, system 210, motherboard 220, and memory 230. System 80 may comprise a chipset and system 210 may comprise a microprocessor compatible with system 80. Memory 230 may comprise any type of memory for storing data, such as a Single Data Rate Random Access Memory, a Double Data Rate Random Access Memory, or a Programmable Read Only Memory.

Motherboard 220 may electrically couple memory 230 to device 1 and to IC die 90. More particularly, motherboard 220 may comprise a memory bus (not shown) that is electrically coupled to solder balls 100 and to memory 230. Accordingly, device 1 may operate to transmit data between IC die 90 and memory 230.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A device comprising:
   a first layer of a multilayer substrate having a first portion and a second portion;
   a second layer of a multilayer substrate having a third portion and a fourth portion;
   a first section of an inductor disposed in the second portion of the first layer;
   a second section of the inductor disposed in the third portion of the second layer, the second section of the inductor coupled at a plurality of locations to the first section of the inductor;
   a shielding plane disposed between the first layer and the second layer;
   a first dielectric layer disposed between the first layer of a multilayer substrate and the shielding plane; and
   a second dielectric layer disposed between the first layer of a multilayer substrate and the shielding plane,
   wherein an imaginary vector normal to the first section of an inductor does not intersect any other section of the inductor.

2. A device according to claim 1, wherein the shielding plane comprises a ground plane.

3. A device according to claim 1, wherein current is to flow in a first direction in the first portion of the inductor and in a second direction opposite to the first direction in the second portion of the inductor.

4. A device according to claim 1, further comprising:
   a third portion of the inductor disposed in a third layer of the multilayer substrate, the third portion coupled to the second portion; and
   a second shielding plane disposed between the second portion and the third portion.

5. A device according to claim 1, wherein the inductor comprises a spiral turn inductor.

6. A device according to claim 1, further comprising:
   a plurality of vias to couple the first portion to the second portion.

7. A device according to claim 1, further comprising:
   a plurality of pin-through holes to couple the first portion to the second portion.

8. A device according to claim 1, further comprising:
   a dielectric disposed between the first layer and the shielding plane and between the second layer and the shielding plane.

9. A method comprising:
   fabricating a first layer of a multilayer substrate having a first portion and a second portion;
   fabricating a second layer of a multilayer substrate having a third portion and a fourth portion;
   fabricating a first section of an inductor disposed in the second portion of the first layer;
   fabricating a second section of the inductor disposed in the third portion of the second layer, the second section of the inductor coupled at a plurality of locations to the first section of the inductor;

fabricating a shielding plane disposed between the first layer and the second layer;

fabricating a first dielectric layer disposed between the first layer of a multilayer substrate and the shielding plane; and fabricating a second dielectric layer disposed between the first layer of a multilayer substrate and the shielding plane, wherein an imaginary vector normal to the first section of an inductor does not intersect any other section of the inductor.

10. A method according to claim 9, wherein the shielding plane comprises a ground plane.

11. A method according to claim 9, wherein current is to flow in a first direction in the first portion of the inductor and in a second direction opposite to the first direction in the second portion of the inductor.

12. A method according to claim 9, further comprising:

fabricating a fourth layer of the multilayer substrate above the third layer, the fourth layer comprising a second shielding plane; and fabricating a fifth layer of the multilayer substrate above the fourth layer, the fifth layer comprising a third portion of the inductor, wherein the fourth layer comprises a second coupling to electrically couple the second portion of the inductor to the third portion of the inductor.

* * * * *